(12) United States Patent
Mikawa et al.

(10) Patent No.: US 7,115,937 B2
(45) Date of Patent: Oct. 3, 2006

(54) SEMICONDUCTOR DEVICE AND METHOD FOR MANUFACTURING THE SAME

(75) Inventors: Takumi Mikawa, Ootsu (JP); Yuuji Jyuudai, Uji (JP); Shinya Natsume, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/270,156

(22) Filed: Nov. 9, 2005

(65) Prior Publication Data
US 2006/0060908 A1    Mar. 23, 2006

Related U.S. Application Data

(62) Division of application No. 10/642,955, filed on Aug. 18, 2003, now Pat. No. 7,008,840.

(30) Foreign Application Priority Data
Aug. 26, 2002  (JP) .............................. 2002-245670

(51) Int. Cl.
*H01L 27/108* (2006.01)
(52) U.S. Cl. ..................................... 257/310; 257/295
(58) Field of Classification Search ................ 257/295, 257/310
See application file for complete search history.

(56) References Cited

U.S. PATENT DOCUMENTS

| 5,843,830 | A  | 12/1998 | Graettinger et al. |
| 6,210,999 | B1 | 4/2001  | Gardner et al.    |
| 6,339,008 | B1 | 1/2002  | Takenaka          |

FOREIGN PATENT DOCUMENTS

JP      10-321628      12/1998

*Primary Examiner*—Jack Chen
(74) *Attorney, Agent, or Firm*—Hamre, Schumann, Mueller & Larson, P.C.

(57) ABSTRACT

A method for manufacturing a semiconductor device includes the steps of forming a conductive layer over a first insulating layer formed on a substrate, and over a plurality of contact plugs formed in the first insulating layer; forming a plurality of capacitor element lower electrodes by patterning the conductive layer; forming a second insulating layer on the first insulating layer and the capacitor element lower electrodes; forming recesses in the second insulating layer at a region above the capacitor element lower electrodes; planarizing the second insulating layer by polishing; exposing the capacitor element lower electrodes; and forming a capacitive insulating film and capacitor element upper electrodes above the capacitor element lower electrodes. In polishing the second insulating layer, leveling of steps can be accelerated, insufficient polishing, peeling of the lower electrodes and generation of scratches can be suppressed, and the global step difference can be reduced.

6 Claims, 14 Drawing Sheets

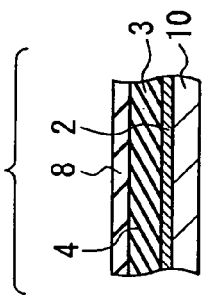
FIG. 13A1
PRIOR ART
Larger memory cell array surface area
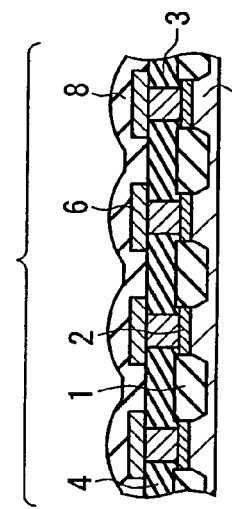
FIG. 13A2
PRIOR ART
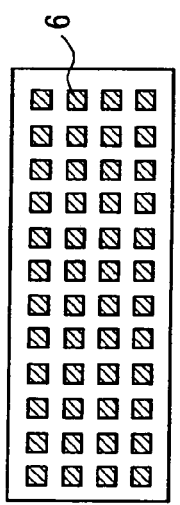
FIG. 13A3
PRIOR ART
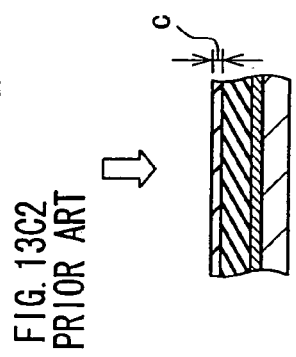
FIG. 13B1
PRIOR ART
Small memory cell array surface area
FIG. 13B2
PRIOR ART
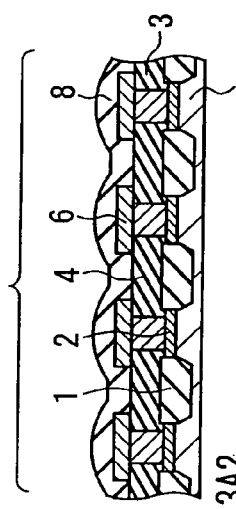
FIG. 13B3
PRIOR ART
Peripheral circuitry without lower electrodes
FIG. 13C1
PRIOR ART
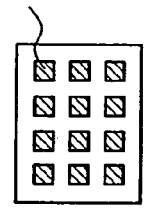
FIG. 13C2
PRIOR ART
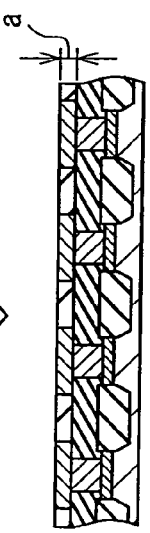
FIG. 13C3
PRIOR ART

SEMICONDUCTOR DEVICE AND METHOD FOR MANUFACTURING THE SAME

This application is a divisional of application Ser. No. 10/642,955, filed Aug. 18, 2003 now U.S. Pat. No. 7,008,840, which application is incorporated herein by reference.

FIELD OF THE INVENTION

The present invention relates to semiconductor devices including a capacitor element with a high dielectric material or a ferroelectric material as a capacitive insulating film, as well as to methods for manufacturing the same.

BACKGROUND OF THE INVENTION

The currently produced type of ferroelectric memories, which are one kind of capacitor elements, uses a so-called planar structure in which the lower electrodes are larger than the upper electrodes, and has a capacity of 1 to 64 kbit. On the other hand, the focus of current development is on ferroelectric memories with a large capacity of 256 kbit to 4 Mbit, which use a so-called stacked structure in which the lower electrodes are smaller than the upper electrodes. It is increasingly expected that these ferroelectric memories with stacked structure are suitable to vastly improve the integration degree and to improve the reliability of non-volatile memories.

Conventional ferroelectric memories with stacked structure are known, in which irregularities in the surface of an insulating film are evened out by CMP (chemical mechanical polishing) to form a ferroelectric film not affected by irregularities of the lower layer and achieve a ferroelectric memory with high reliability (see for example JP H10-321628). The following is an explanation of a conventional method for manufacturing a ferroelectric memory with stacked structure, with reference to FIGS. 11A to 11F. FIGS. 11A to FIG. 11F show sections of a memory cell array portion during the steps of manufacturing a conventional ferroelectric memory.

First, as shown in FIG. 11A, isolation regions 1 are formed on a semiconductor substrate 10, and a high-concentration impurity diffusion layer 2 is formed between the isolation regions 1. Then, an interlayer insulation film 4 is formed on the isolation regions 1 and the impurity diffusion layer 2, and contact plugs 3 that are electrically connected to the impurity diffusion layers 2 are formed in the interlayer insulation film 4. A layered film of a titanium nitride barrier layer and a platinum film serving as a first conductive film 5 is formed on the interlayer insulation film 4 and the contact plugs 3. Next, a resist pattern is formed on the first conductive film 5, and the first conductive film 5 is patterned by dry etching taking the resist pattern as a mask, to form lower electrodes 6 on the contact plugs 3, as shown in FIG. 11B.

Then, as shown in FIG. 11C, covering the lower electrodes 6 and the interlayer insulating film 4, a burying insulating film 8 made of silicon oxide ($SiO_2$) is formed over the entire wafer surface. Next, as shown in FIG. 11D, the insulating film 8 is polished by CMP to planarize its surface, and the surfaces of the insulating film 8 and the lower electrodes 6 are polished until they are flush, as shown in FIG. 11E. Then, as shown in FIG. 11F, a ferroelectric film 9 serving as a capacitive insulating film and a second conductive film 20 (made of platinum or the like) are formed in that order on top of the insulating film 8 and the lower electrodes 6.

Next, although not shown in the drawings, the second conductive film 20 and the ferroelectric film 9 are patterned by dry etching with a resist pattern as the mask to form upper electrodes. After that, ordinarily, a capacitor interlayer insulating film is formed, and after a wiring step and a protective film formation step, the ferroelectric memory is obtained.

With this ferroelectric memory, the surface area of the lower electrodes 6 is smaller than the surface area of the ferroelectric and the upper electrodes above it, and the capacitance of the capacitors is determined by the lower electrodes 6. That is to say, the lower electrode 6 becomes a "capacitance-defining area" that determines the capacity (area) of the capacitor. Moreover, with the structure shown in FIG. 11F, the ferroelectric film 9 is formed on a surface whose irregularities due to the lower electrodes 6 have been planarized, so that the film quality is favorable.

With the above-described manufacturing method, when polishing the insulating film 8 by CMP, the lower electrode 6 is uniformly exposed across the entire wafer surface, and in order to avoid insufficient polishing, which may lead to variations in the capacitive properties of the ferroelectric memory, it is necessary to over-polish to some degree, while giving consideration to the in-plane uniformity of the CMP.

However, since a layer of a precious metal such as Pt that is difficult to polish is formed on the surface of the lower electrodes 6, recesses may be formed near the lower electrodes 6 due to the planarization by CMP, leading to a slight protrusion of the lower electrodes 6. When over-polishing in this situation, polishing stress concentrates in the lower electrodes 6, and the lower electrodes 6 may peel off or scratches may be formed in the lower electrodes 6. For this reason, it was necessary to optimize the polishing time such that there is no insufficient polishing and no scratches are formed, which becomes a factor narrowing the degree of freedom (window) for setting the polishing parameters.

As a result of studying this problem, the inventors found that these scratches tend to occur primarily in regions of low wiring pattern density, with isolated patterns, such as isolated metal wiring, measurement marks, and alignment marks, rather than in regions of high wiring pattern density, such as in memory array portions in which the lower electrodes are integrated.

Referring to FIGS. 12A to 12E, the following is an explanation of a process in which scratches occur. FIGS. 12A to 12A show sections of a metal wiring portion in the steps of manufacturing a ferroelectric memory shown in FIGS. 11A to 11A. The steps in FIGS. 12A to 12E correspond to the steps in FIGS. 11A to 11E respectively, and are performed at the same time.

First, as shown in FIG. 12A, a high-concentration impurity diffusion layer 2 is formed on a semiconductor substrate 10. On top of the impurity diffusion layer 2, an interlayer insulation film 4 and a first conductive film 5 are formed in that order. Then, the first conductive film 5 is patterned by dry etching with a resist pattern as the mask to form a metal wiring 7, as shown in FIG. 12B. Then, as shown in FIG. 12C, a burying insulating film 8 made of silicon oxide ($SiO_2$) is formed over the entire wafer surface, burying the metal wiring 7 and the interlayer insulation film 4, as shown in FIG. 12C. Next, as shown in FIG. 12D, the insulating film 8 is polished by CMP to planarize its surface.

In regions with a low density of wiring patterns, such as portions in which an isolated metal wiring 7 is arranged, the volume of the polished insulating film 8 is smaller, so that in the polishing step, they are polished faster than regions with a high density of wiring patterns, as in the memory cell array portion. Therefore, the leveling of steps progresses faster, and the metal wiring 7 is exposed more quickly from the insulating film 8 than the lower electrodes 6 (see FIG. 11D). In this situation, an over-polishing is performed until the surfaces of the insulating film 8 and the lower electrodes 6 are flush, as shown in FIG. 11E. As a result, recesses are formed near the metal wiring 7, which is already exposed, causing the metal wiring 7 to stick out. Thus, polishing stress concentrates at the metal wiring 7, and the metal wiring 7 may be peeled off, as shown in FIG. 12E. This peeled metal wiring 7 may become a cause for scratches, resulting in a chain of peeling of metal wiring 7 and occurrence of scratches.

This phenomenon occurs due to differences in the density of memory cells and differences in the occupied area on the wafer. FIG. 13 schematically illustrates the situation when the surface of the lower electrodes 6 is exposed by CMP in the process of manufacturing an element including memory array portions with different array surface area. FIGS. 13A1 to 13C1 are plan views showing the arrangement of the lower electrodes 6 for a memory cell array portion with large array surface area, a memory cell array portion with small array surface area, and a region without lower electrodes 6 (referred to below as "peripheral circuit portion"). FIGS. 13A2 to 13C2 show sections of these regions. These regions are all polished at the same time.

When the surfaces of the lower electrodes 6 in the memory cell array portion with large array surface area are exposed, as shown in FIG. 13A3, recesses are formed near the lower electrodes 6 in the memory cell array portion with small array surface area, as shown in FIG. 13B3, and the lower electrodes 6 are peeled off. In the peripheral circuit portion shown in FIG. 13C3, the polishing speed for the flat insulating film 8 (referred to as a "solid film" in the following) is dominant, so that the global level difference becomes large. Here, "global level difference" refers to the difference between the maximum film thickness and the minimum film thickness of the film remaining on the wafer surface.

The following is a quantitative explanation of this phenomenon with reference to FIG. 14, modeling the polishing state at the memory cell array portions with large and small array surface area and the peripheral circuit portion.

In the graph of FIG. 14, the horizontal axis marks the polishing time, and the vertical axis marks the thickness of the remaining film after polishing by CMP of an insulating film (of 400 nm thickness) formed on the lower electrodes (of 300 nm thickness). The thickness of the remaining film is plotted for the memory cell array portion with large array surface area, the one with small array surface area, and for the peripheral circuit portion. Note, however, that for the peripheral circuit portion, the thickness of the remaining film on the interlayer insulation film 4 is shown. Looking at how the thickness of the remaining film changes with the polishing time, it can be seen that the peripheral circuit portion is polished uniformly with the polishing speed of the solid film (200 nm/min). On the other hand, it can be seen that at the ferroelectric memory cell area portions in which the lower electrodes 6 are provided underneath, there is a time period at the start of the polishing during which the leveling of steps is accelerated, followed by a time period during which the polishing is carried out at the polishing speed of the solid film.

As shown in FIG. 14, in order to expose all of the lower electrodes 6, the polishing time needs to be set to 90 sec (1.5 min), because 90 sec are necessary in order to ensure that the thickness of the remaining film in the memory cell array portion with large array surface area becomes 0 nm. In this case, the memory array cell portion with small array surface area is over-polished for 0.5 min, and recesses of 100 nm (=200 nm/min×0.5 min) are formed near the lower electrodes 6. This becomes a cause for peeling of the lower electrodes 6. On the other hand, the peripheral circuit portion is polished by 300 nm (=200 nm/min×1.5 min). Consequently, the remaining film thicknesses a, b and c of the insulating film shown in FIGS. 13A3 to 13C3 will be a=300 nm, b=200 nm and c=100 nm. Thus, the global level difference is a−c=200 nm.

As explained above, when memory cell array portions with different array surface area and peripheral circuit portions are both present, then there are regions at which the leveling of steps is accelerated and other regions that are polished at the polishing speed of the solid film, and when looking at the entire wafer surface, the non-uniformities in the polishing speed are large. As a result, the global step difference is large, and it is difficult to eliminate insufficient polishing and avoid scratches both. Such insufficient polishing, peeling of the lower electrodes and scratches cause bit defects in the ferroelectric memory and lower the production yields.

Furthermore, the ferroelectric memory is a non-volatile memory that stores data for a predetermined period of time, and from which the data can be read out when necessary, so that it is preferable that the ferroelectric memory is fabricated uniformly. In particular, variations in the film thickness of the ferroelectric film due to recesses have a considerable influence on the reliability with which data is held and on the ferroelectric memory properties, so that they should be reduced to a minimum.

Moreover, in ferroelectric memories, the global step difference between the memory cell array portion and other portions (for example peripheral logic circuitry in system LSI with integrated FeRAM) may lead to an insufficient DOF (depth of focus) of lithography in the wiring step, and may result in shorts between conductors or variations in the wiring resistance, and may directly affect the production yield.

SUMMARY OF THE INVENTION

It is an object of the present invention to present a method for manufacturing a semiconductor device, with which leveling of steps is accelerated when polishing an insulating film that buries the lower electrodes of capacitor elements, with which insufficient polishing of the burying insulating film, peeling of the lower electrodes and scratches are suppressed, and with which the global step difference can be reduced.

In order to solve this problem, a method for manufacturing a semiconductor device includes: forming a conductive layer on a first insulating layer formed on a substrate, and on a plurality of contact plugs formed in the first insulating layer; forming a plurality of capacitor element lower electrodes by patterning the conductive layer; forming a second insulating layer on the first insulating layer and the capacitor element lower electrodes; forming a recess in the second insulating layer at a region above the capacitor element lower electrodes; planarizing the second insulating layer by polishing; exposing the capacitor element lower electrodes; and forming a capacitive insulating film and capacitor element upper electrodes above the capacitor element lower electrodes.

A semiconductor device in accordance with the present invention includes a substrate; a first insulating layer formed on the substrate; a contact plug formed in the first insulating layer; a capacitor element lower electrode formed on the first insulating layer and connected to the contact plug; a second insulating layer formed burying the capacitor element lower electrode and its surroundings; a capacitive insulating film formed covering the capacitor element lower electrode; and a capacitor element upper electrode formed above the capacitor element upper electrode with the capacitive insulating film interposed in between, such that the capacitor element lower electrode becomes a capacitance-defining area. A plurality of capacitor elements composed of the capacitor element lower electrode, and the capacitive insulating film and the capacitor element upper electrode are arranged in a capacitor element group. A surface of the capacitor element lower electrodes and the second insulating layer is planarized by polishing, and a surface area of the capacitor element group is within the range of 10,000 to 100,000 $\mu m^2$.

BRIEF DESCRIPTION OF THE DRAWINGS

FIGS. 13A1 to 13A3, 13B1 to 13B3 and 13C1 to 13C3 are schematic diagrams illustrating how memory cell array portions with different array surface areas are polished by CMP.

DESCRIPTION OF THE PREFERRED EMBODIMENTS

Figure 1A:
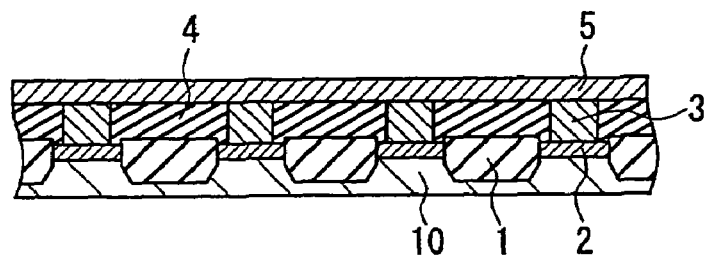
FIGS. 1A to 1J are sectional views illustrating a method for manufacturing a ferroelectric memory in accordance with Embodiment 1.

With the method for manufacturing a semiconductor device of the above-noted configuration, by forming a recess in the second insulating layer burying the capacitor element lower electrodes, the polishing volume of the second insulating film at the recess is decreased, the polishing time is shortened, and leveling of steps is accelerated. As a result, the uniformity of the polishing speed across the entire wafer is improved, insufficient polishing, peeling of the lower electrodes and occurrence of scratches can be suppressed, and the global step difference can be reduced.

It is preferable that the step of exposing the capacitor element lower electrodes is carried out by etchback. It is also preferable that the step of planarizing the second insulating layer by polishing is carried out by CMP (chemical mechanical polishing).

In the method of the present invention, the step of planarizing the second insulating layer by polishing and the step of exposing the capacitor element lower electrodes may be carried out by a single step for planarization and exposure. It is preferable that this step for planarization and exposure is carried out by CMP.

In the step of forming capacitor element lower electrodes in the method of the present invention, metal conductors may be formed together with the capacitor element lower electrodes by patterning the conductive layer. In this case, it is preferable that recesses in the second insulating layer are formed only in a region at which the capacitor element lower electrodes are arranged. Thus, peeling of the metal wiring due to over-polishing can be suppressed in the metal wiring portions, in which usually the wiring pattern density is low, and the step leveling is fast.

It is furthermore preferable that the surface of the conductive layer is made of Pt, Ir, Ru, an alloy thereof or a metal oxide thereof. These materials are susceptible to scratches, so that the effect of the present invention is particularly striking.

It is furthermore preferable that the step of forming a recess in the second insulating layer is performed by dry etching. With dry etching, it is easy to form recesses in the second insulating layer. In this case, it is preferable that a depth of the recesses formed in the second insulating layer is substantially the same as a film thickness of the capacitor element lower electrodes. Thus, the surface of the second insulating film and the surface of the capacitor element lower electrodes have the same height, and the polishing time that is needed for planarization can be estimated by calculation with the polishing time for a solid film. Furthermore, the influence that the wiring pattern density of the capacitor element electrode and the surface area of a capacitor element group including a plurality of capacitor elements have on the polishing time can be reduced to a minimum.

It is furthermore preferable that at least a portion of the capacitor element lower electrodes is exposed during the formation of the recess in the second insulating film. Thus, insufficient polishing above the capacitor element lower electrodes can be eliminated even more reliably. It is also preferable that the dry etching is performed such that a taper angle of less than 90° is formed at a bottom corner of the recess formed in the second insulating layer. Thus, the margin for displacement of the resist mask can be improved, and the recesses can be formed more reliably above the capacitor element lower electrodes. Moreover, the polishing amount of the second insulating layer can be decreased, and the polishing time can be shortened.

In the method of the present invention, it is further preferable that the second insulating film is an SiO$_2$ film formed by atmospheric CVD using ozone and TEOS (tetraethylorthosilicate). Thus, it is possible to suppress the damage that is inflicted on the capacitor element lower electrodes if for example plasma CVD is used for the film formation, and the hydrogen in the plasma deoxidizes the oxygen barrier below it by catalytic action of the Pt contained in the lower electrodes. Moreover, through the so-called self-flowing effect, the recesses of the second insulating layer between capacitor element lower electrodes become smooth by film formation only, which is advantageous for accelerating step leveling.

It is furthermore preferable that a region of the recess of the second insulating layer is made larger than the capacitor element lower electrodes below that region. Thus, the polishing amount of the second insulating film can be reduced, and the polishing time can be shortened.

It is furthermore preferable that the recesses of the second insulating layer are formed in a size spanning a region above a plurality of the capacitor element lower electrodes. Thus, the polishing amount of the second insulating film can be reduced, and the polishing time can be shortened.

With the semiconductor device of the above-described configuration, the polishing speed easily can be made uniform across the entire wafer surface, insufficient polishing, peeling of the lower electrodes and occurrence of scratches can be suppressed, and the global step difference can be reduced. If a plurality of the capacitor element groups are provided, then it is preferable that a spacing between adjacent capacitor element groups is within the range of 10 to 100 μm.

The following is a more specific description of embodiments of the present invention, with reference to the accompanying drawings.

Embodiment 1

A method for manufacturing a ferroelectric memory in accordance with Embodiment 1 of the present invention is described with reference to FIGS. 1A to 1J. These drawings show a section of a memory cell array portion during the steps of manufacturing a ferroelectric memory.

First, as shown in FIG. 1A, isolation regions 1 are formed on a semiconductor substrate 10, and a high-concentration impurity diffusion layer 2 is formed between the isolation regions 1. Then, an interlayer insulation film 4 made of SiO$_2$ is formed on the isolation regions 1 and the impurity diffusion layer 2, and contact plugs 3 (made of tungsten) that are electrically connected to the impurity diffusion layers 2 are formed in the interlayer insulation film 4. A layered film (of 300 nm thickness) including a titanium nitride barrier layer (150 nm thick) and a platinum film (150 nm thick) serving as a first conductive film 5 is formed on the interlayer insulation film 4 and the contact plugs 3.

Figure 1B:
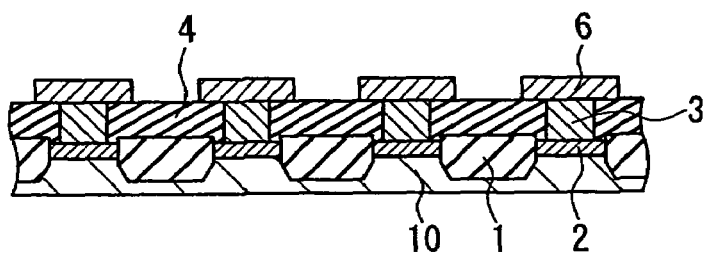
Figure 1C:
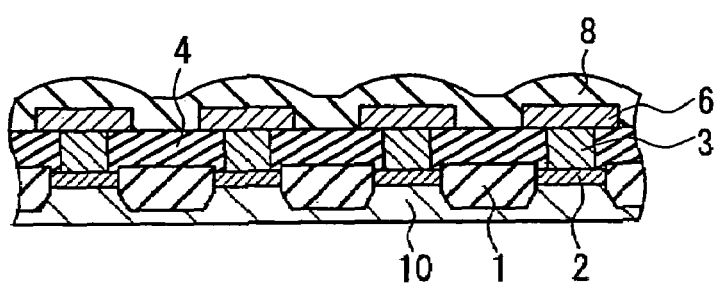
Figure 1D:
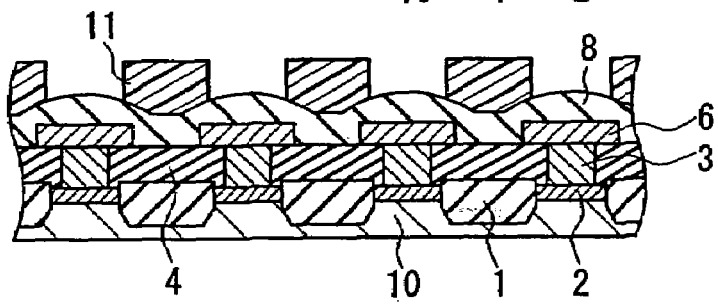

Next, the first conductive film 5 is patterned by dry etching taking a resist pattern as a mask to form lower electrodes 6 on the contact plugs 3, as shown in FIG. 1B. Then, covering the lower electrodes 6 and the interlayer insulation film 4, a burying insulating film 8 (400 nm thick) made of silicon oxide (SiO$_2$), for example, is formed over the entire wafer, as shown in FIG. 1C. It is preferable that the film thickness of this burying insulating film 8 is set to the thickness of the lower electrodes 6 plus a polishing margin that is necessary for step leveling during the polishing as explained below. Then, a resist pattern 11 having aperture portions is formed on the lower electrodes 6, as shown in FIG. 1D.

Figure 1E:
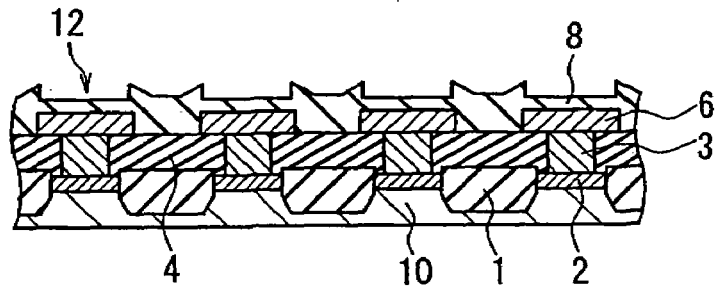

Next, as shown in FIG. 1E, a portion of the insulating film 8 at the aperture portions of the resist pattern 11 is removed by dry etching, forming recesses 12. It is preferable that the depth of the recesses 12 is set approximately to a depth at which the recesses 12 are not transferred to the layers below when polished later by CMP. Thus, the polishing amount of the insulating film 8 can be decreased, and the step leveling can be accelerated, and the difference in polishing speed between those regions and regions with low wiring pattern density becomes low.

Figure 1F:
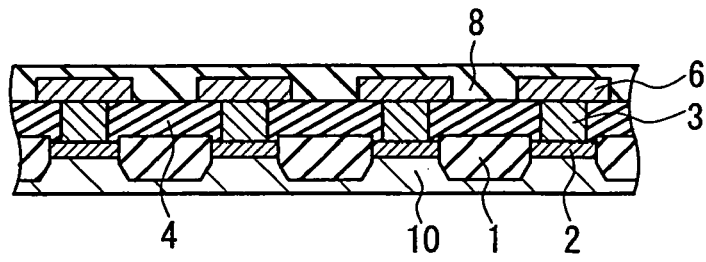
Figure 1G:
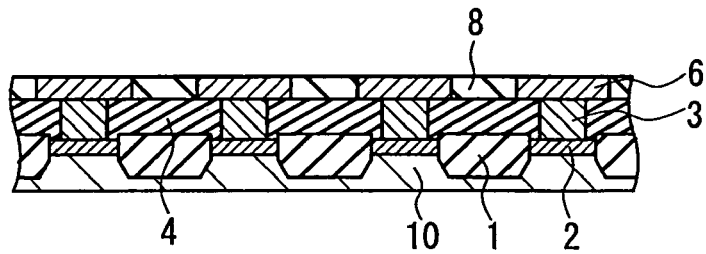

Then, as shown in FIG. 1F, the insulating film 8 is polished by CMP to planarize its surface. In this situation, the surface of the lower electrodes 6 is not exposed. Then, as shown in FIG. 1G, the insulating film 8 is etched by etchback until the surface of the lower electrodes 6 is exposed. It is preferable that dry etching is used for the etchback of the insulating film 8. This is because with dry etching, the influence of micro-scratches due to the CMP of the previous step can be eliminated, so that they can be prevented from spreading. It should be noted, however, that in cases in which hardly any micro-scratches occur from the CMP of the previous step and a ferroelectric material is used with which damage to the lower electrodes 6 strongly affects the ferroelectric properties, it is also possible to use wet etching, as appropriate.

Figure 1H:
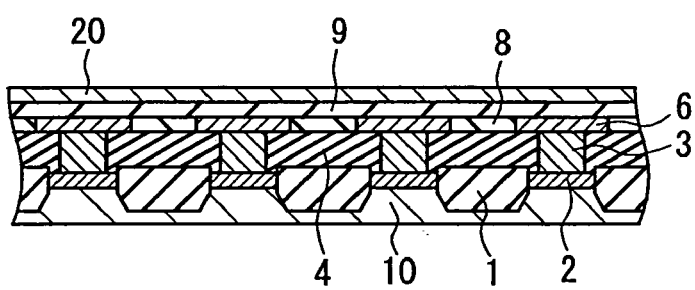
Figure 1I:
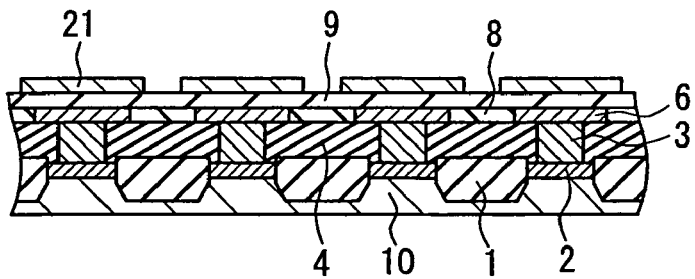
Figure 1J:
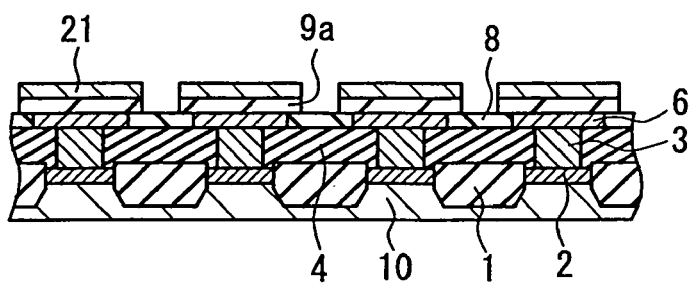

Next, as shown in FIG. 1H, a ferroelectric film 9 functioning as a capacitive insulating film is formed on the insulating film 8 and the lower electrodes 6, and a second conductive film 20 (platinum film or the like) is formed thereon. Then, patterning the second conductive film by dry etching with a resist pattern as a mask, upper electrodes 21 as shown in FIG. 1I are formed. It is also possible to form upper electrodes 21 and ferroelectric films 9a by patterning the second conductive film 20 and the ferroelectric film 9 by dry etching with a resist pattern as the mask, as shown in FIG. 1J. After that, although not shown in the drawings, an interlayer insulating film for a capacitor is formed, and after a wiring step and a protective film formation step, the ferroelectric memory is obtained.

With this embodiment, by forming recesses 12 in the insulating film 8 on the lower electrodes 6, the polished volume of the insulating film 8 in the recesses 12 is reduced, so that the polishing time is shortened, and step leveling is accelerated. Moreover, a slurry enters the recesses 12 and polishing pads are adapted to the layers below, so that the fact that the polishing pads of the CMP in the recesses 12 and the contact area of the insulating film 8 are large also contributes to accelerating step leveling. As a result, the uniformity of the polishing speed across the entire wafer surface can be improved, insufficient polishing, peeling of the lower electrodes 6 and scratches can be suppressed, and the global step difference can be reduced.

Moreover, this embodiment is characterized by the acceleration of step leveling by forming recesses 12 in the insulating film 8, in addition to the method combining a step of planarizing the insulating film 8 by CMP as it was formed and a step of exposing the lower electrodes 6 by etchback. The effect of this characteristic feature is explained below.

In the method of exposing the surface of the lower electrode 6 by etchback after planarization by CMP, the lower electrodes 6 are not exposed while CMP is being performed, which has the considerably advantageous effect of suppressing the peeling of the lower electrodes 6 and the occurrence of scratches. In this case, however, the insulating film 8 needs to be made thicker than in the case that the insulating film 8 is planarized and the lower electrodes 6 are exposed only by CMP, leading to an increase in the amount of recesses formed in the insulating film 8 around the lower electrodes. The following is a comparison of examples of the amount of recesses. The recesses have been calculated by a sum of squares calculation.

1) Planarization and exposure of the lower electrodes 6 performed by CMP only:

TABLE 1

|  | (nm) | in-plane uniformity (%) | range of fluctuations (nm) | width of fluctuations (nm) |
| --- | --- | --- | --- | --- |
| thickness of insulating film 8 | 400 | 5 | ±20.0 | 40.0 |
| CMP polishing amount | 150 | 15 | ±22.5 | 45.0 |
| recess amount |  |  | ±30.1 | 60.2 |

2) Combination of planarization performed by CMP and exposure of the lower electrodes 6 performed by etchback:

TABLE 2

|  | (nm) | in-plane uniformity (%) | range of fluctuations (nm) | width of fluctuations (nm) |
| --- | --- | --- | --- | --- |
| thickness of insulating film 8 | 500 | 5 | ±25.0 | 50.0 |
| CMP polishing amount | 150 | 15 | ±22.5 | 45.0 |
| etchback | 100 | 5 | ±5.0 | 10.0 |
| recess amount |  |  | ±34.0 | 68.0 |

Thus, in case of a combination of planarization by CMP and exposing the lower electrodes 6 by etchback, the variations in the recess amount increase. In this case, the amount of variations in the thickness of the insulating film 8 due to having made the insulating film 8 thicker become dominant compared to the increase of variations in the recess amount.

On the other hand, by forming the recesses 12 in the insulating film 8, it is possible to reduce the thickness of the insulating film 8 that is necessary to achieve a similar degree of planarization. That is to say, step leveling is accelerated by forming the recesses 12, so that the amount polished by CMP for obtaining a similar degree of planarization can be decreased. As a result, the variations in the recess amount become as follows.

3) Combination of planarization by CMP, exposure of the lower electrodes 6 by etchback, and formation of recesses:

TABLE 3

|  | (nm) | in-plane uniformity (%) | range of fluctuations (nm) | width of fluctuations (nm) |
| --- | --- | --- | --- | --- |
| thickness of insulating film 8 | 450 | 5 | ±24.0 | 48.0 |
| CMP polishing amount | 100 | 15 | ±15.0 | 30.0 |
| etchback | 100 | 5 | ±5.0 | 10.0 |
| recess amount |  |  | ±28.7 | 57.4 |

Thus, through a combination of planarization by CMP, exposure of the lower electrodes 6 by etchback, and formation of recesses, the effect of combining planarization by CMP and exposure of the lower electrodes 6 by etchback can be attained without increasing variations in the recess amount, that is, the effect of suppressing peeling of the lower electrodes 6 and the occurrence of scratches can be achieved.

Embodiment 2

The following is a description of a method for manufacturing a ferroelectric memory according to Embodiment 2 of the present invention, with reference to FIGS. 2A to 2F. FIGS. 2A to 2F shows a section of a memory cell array portion during the steps of manufacturing a ferroelectric memory. This embodiment is an example of a modification of the manufacturing method according to Embodiment 1. The steps in FIGS. 2A to 2D are similar to those in FIGS. 1A to 1D, so that their further explanation has been omitted.

Figure 2A:
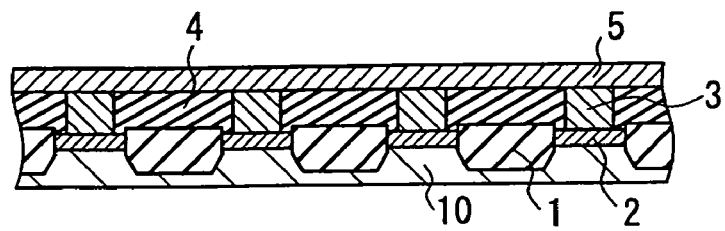
FIGS. 2A to 2F are sectional views illustrating a method for manufacturing a ferroelectric memory in accordance with Embodiment 2.
Figure 2B:
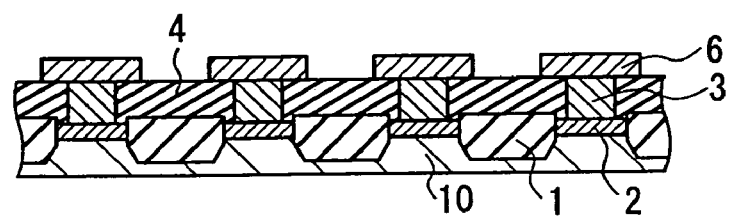
Figure 2C:
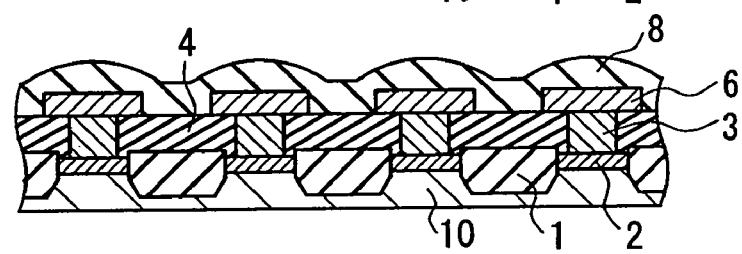
Figure 2D:
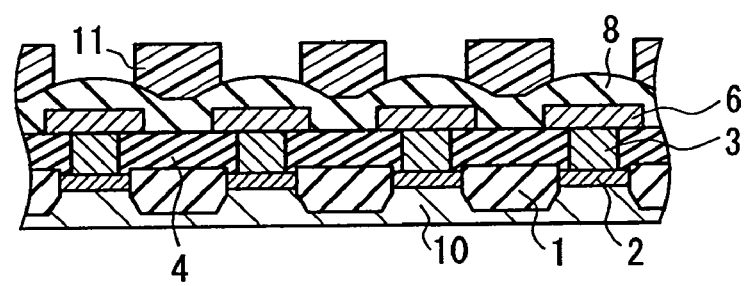
Figure 2E:
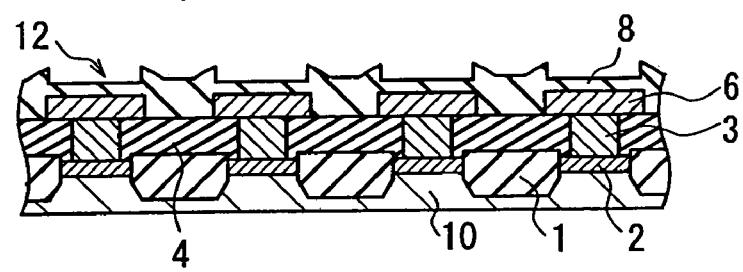

As shown in FIG. 2E, the insulating film 8 at the aperture portions of the resist pattern 11 is partially removed by dry etching to form the recesses 12. It is preferable that the depth of the recesses 12 is as deep as possible. By forming the recesses 12, the polishing amount of the insulating film 8 in the following polishing step can be reduced, accelerating the step leveling.

Figure 2F:
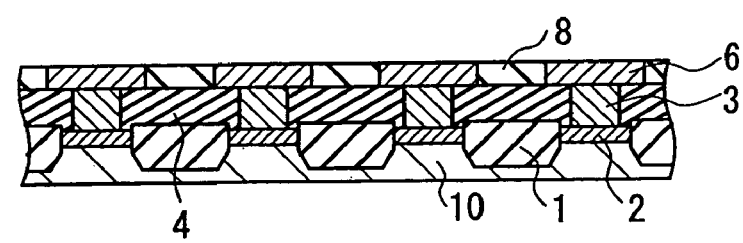

Then, as shown in FIG. 2F, the insulating film 8 is polished by CMP to planarize and smoothen its surface, the surface is polished until the surface of the lower electrodes 6 is exposed, and a planar state is reached in which the lower electrodes 6 and the insulating film 8 are flush. Thus, in this embodiment, different from the step of FIG. 1F, the planarization of the surface of the insulating film 8 and the exposure of the surface of the lower electrodes 6 is performed by CMP only.

Then, although not shown in the drawings, a ferroelectric film serving as a capacitive insulating film is formed on top, and a second conductive film (platinum film or the like) is formed thereon. Then, upper electrodes are formed by patterning the second conductive film and the ferroelectric film by dry etching with a resist pattern as a mask. After that, ordinarily a capacitor interlayer insulating film is formed, and after a wiring step and a protective film formation step, the ferroelectric memory is obtained.

With this embodiment, as in Embodiment 1, forming the recesses 12 accelerates the step leveling of the insulating film 8 at the recesses 12. As a result, the uniformity of the polishing speed across the entire wafer surface can be improved, insufficient polishing, peeling of the lower electrodes and scratches can be suppressed, and the global step difference can be reduced.

Embodiment 3

Figure 3A:
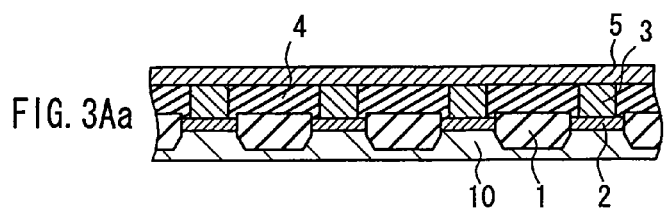
FIGS. 3Aa to 3Af and 3Ba to 3Bf are sectional views illustrating a method for manufacturing a ferroelectric memory in accordance with Embodiment 3.
Figure 3B:
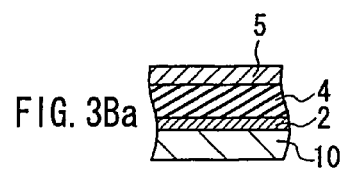
Figure 3A:
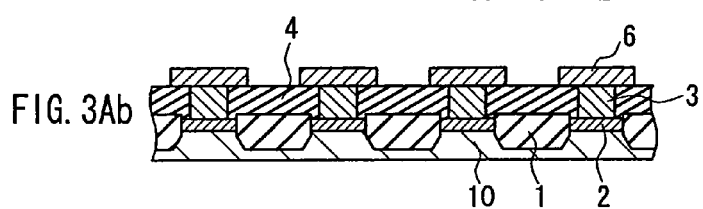
Figure 3B:
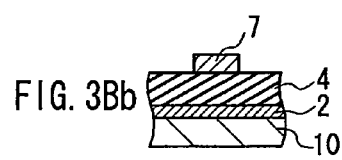
Figure 3A:
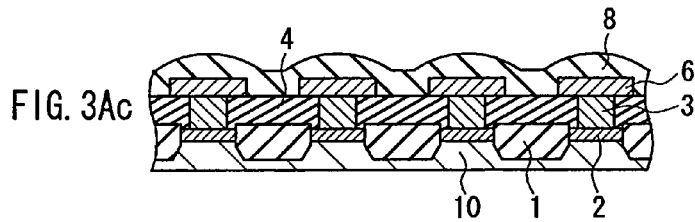
Figure 3B:
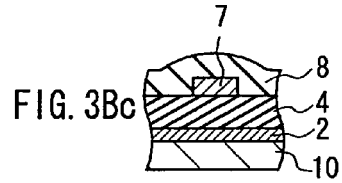
Figure 3A:
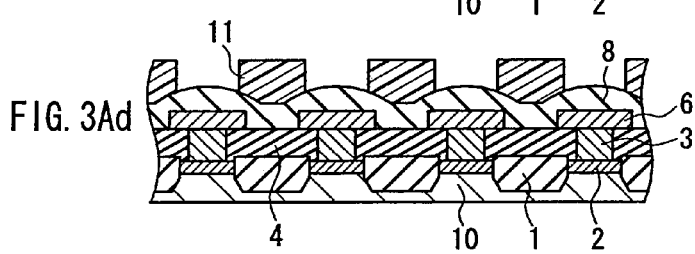
Figure 3B:
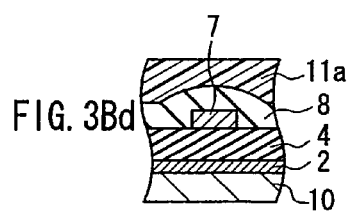
Figure 3A:
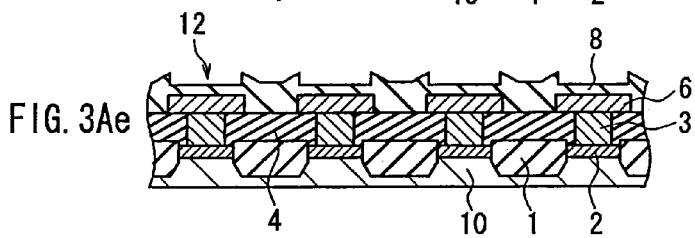
Figure 3B:
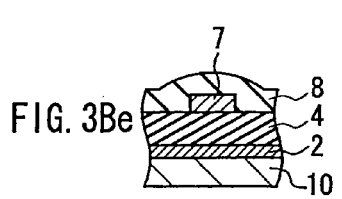
Figure 3A:
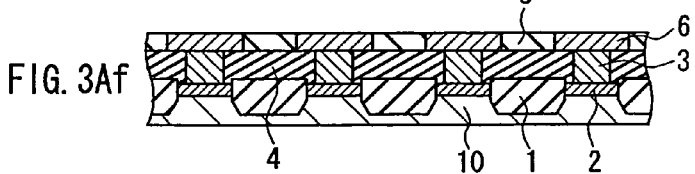
Figure 3B:
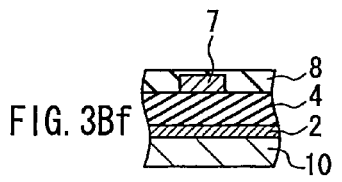

Referring to FIGS. 3Aa to 3Af, the following is a description of a method for manufacturing a ferroelectric memory according to Embodiment 3 of the present invention. FIGS. 3Aa to 3Af show sectional views of a memory cell array portion during the steps of manufacturing a ferroelectric memory. FIGS. 3Ba to 3Bf show sectional views of a metal wiring portion. The steps of FIGS. 3Aa to 3Af correspond to the steps of 3Ba to 3Bf, and are performed at the same time.

First, in a memory cell array portion, isolation regions 1 are formed on a semiconductor substrate 10, and a high-concentration impurity diffusion layer 2 is formed between the isolation regions 1, as shown in FIG. 3Aa. Then, an interlayer insulation film 4 made of $SiO_2$ is formed on the isolation regions 1 and the impurity diffusion layer 2, and contact plugs 3 (made of tungsten) that are electrically connected to the impurity diffusion layers 2 are formed in the interlayer insulation film 4. A layered film (of 300 nm thickness) including a titanium nitride barrier layer (150 nm thick) and a platinum film (150 nm thick) serving as a first conductive film 5 is formed on the interlayer insulation film 4 and the contact plugs 3. At the same time, as shown in FIG. 3Ba, a high-concentration impurity diffusion layer 2, an interlayer insulation film 4 and a first conductive film 5 are formed on the semiconductor substrate 10 in the metal wiring portion by the same steps as for the memory cell array portion.

Next, in the memory cell array portion, the first conductive film 5 is patterned by dry etching taking a resist pattern as a mask to form lower electrodes 6 (of 300 nm height) on the contact plugs 3, as shown in FIG. 3Ab. In the metal wiring portion, metal wiring 7 is formed, as shown in FIG. 3Bb.

Then, as shown in FIGS. 3Ac and 3Bc, the lower electrodes 6 and the interlayer insulating film 4 in the memory cell array portion and the metal wiring 7 and the interlayer insulating film 4 in the metal wiring portion are covered by forming a burying insulating film 8 (of 400 nm height) across the entire wafer surface. It is preferable that the film thickness of this burying insulating film 8 is set to the thickness of the lower electrodes 6 plus the polishing margin that is necessary for step leveling during the polishing as explained below.

Then, a resist pattern 11 having aperture portions is formed in the memory cell array portion on the lower electrodes 6 using a resist mask, as shown in FIG. 3Ad. On the other hand, a resist pattern 11a without aperture portions is formed in the metal wiring portion, as shown in FIG. 3Bd.

Then, as shown in FIG. 3Ae, a portion of the insulating film 8 at the aperture portions of the resist pattern 11 is removed by dry etching, thus forming recesses 12. On the other hand, no recesses 12 are formed in the insulating film 8 on the metal wiring 7. It is preferable that the depth of the recesses 12 is as deep as possible. Thus, the polishing amount of the insulating film 8 can be reduced, step leveling can be accelerated, and the difference to the polishing speed of regions with low wiring pattern density can be decreased.

Moreover, as shown in FIGS. 3Af and 3Bf, the insulating film 8 is polished by CMP to planarize and smoothen its surface, the surface is polished until the surface of the lower electrodes 6 is exposed, and a planar state is reached in which the lower electrodes 6 and the insulating film 8 are flush. By suitably adjusting the depth of the recesses 12 formed in the step of FIG. 3Ae, it is possible to expose the lower electrodes 6 and the metal wiring 7 at the same time during the polishing by CMP. It should be noted that since no recesses 12 are formed on the metal wiring 7, the step leveling is not accelerated, and insulating film 8 may remain on the metal wiring 7 as shown in FIG. 3Bf, but not only does this not affect the properties of the ferroelectric memory, but it reliably suppresses scratches through peeling of the metal wiring and is therefore preferable.

Then, although not shown in the drawings, a ferroelectric film serving as a capacitive insulating film and a second conductive film (platinum film or the like) are formed in that order. Then, upper electrodes are formed by patterning the second conductive film and the ferroelectric film by dry etching. After that, ordinarily a capacitor interlayer insulating film is formed, and after a wiring step and a protective film formation step, the ferroelectric memory is obtained.

With this embodiment, it is possible to suppress the occurrence of scratches caused by peeling of the metal wiring 7 due to over-polishing in the metal wiring portion, in which the wiring pattern density is usually low and step leveling is accelerated.

This embodiment is an example in which the planarization of the insulating film 8 and the exposure of the surface of the lower electrodes 6 are both performed by CMP, as in Embodiment 2. On the other hand, this embodiment also can be applied and the same effects can be attained even when the planarization of the insulating film 8 is performed by CMP and the exposure of the surface of the lower electrodes 6 is performed by etchback, as in Embodiment 1. This is also true for the embodiments explained below.

It should be noted that the insulating film 8 described in the above Embodiments 1 to 3 is preferably formed by atmospheric CVD, using ozone and TEOS. By contrast, if plasma CVD is used for the film formation, the hydrogen in the plasma deoxidizes the oxygen barrier below it by catalytic action of the Pt contained in the lower electrodes 6, damaging the lower electrodes 6. With atmospheric CVD, such damage is not inflicted, and through the so-called self-flowing effect, it is possible to accelerate the step leveling during the film formation only.

Moreover, if the surface of the conductive film described in Embodiments 1 to 3 is made of Pt, Ir, Ru, an alloy thereof or an oxide thereof, then the effect of applying the present invention is particularly large, because these materials are particularly prone to scratches.

Moreover, in the step of forming the recesses 12 in the insulating film 8 explained for Embodiments 1 to 3, for example a mixed gas of $Ar/C_4F_8/CH_2F_2/O_2$ may be used as the etching gas used for the dry etching. Suitable etching parameters are for example a pressure of 0.665 Pa, a source power of 2 KW, and a bias output of 2.2 KW.

Embodiment 4

Referring to FIGS. 4A to 4E, the following is a description of a method for manufacturing a ferroelectric memory according to Embodiment 4 of the present invention. FIGS. 4A to 4E show sectional views illustrating the manufacturing steps for a ferroelectric memory. This embodiment is an example of the case in which a region where lower electrodes are formed is adjacent to a region where no lower electrodes are formed.

Figure 4A:
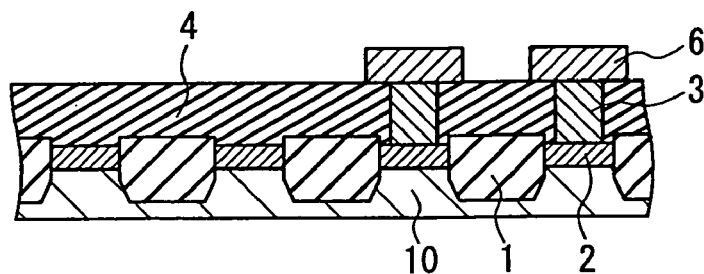
FIGS. 4A to 4E are sectional views illustrating a method for manufacturing a ferroelectric memory in accordance with Embodiment 4.

First, as shown in FIG. 4A, isolation regions 1 are formed on a semiconductor substrate 10, and a high-concentration impurity diffusion layer 2 is formed between the isolation regions 1. Then, an interlayer insulation film 4 made of $SiO_2$ is formed on the isolation regions 1 and the impurity diffusion layer 2, and contact plugs 3 (made of tungsten) that are electrically connected to the impurity diffusion layers 2 are formed in the interlayer insulation film 4. A layered film (of 300 nm thickness) including a titanium nitride barrier layer (100 nm thick) and a platinum film (200 nm thick) serving as a first conductive film is formed on the interlayer insulation film 4 and the contact plugs 3. Next, the first conductive film patterned by dry etching taking a resist pattern as a mask to form lower electrodes 6 (of 300 nm height) on the contact plugs 3. As shown in the figures, the region where the lower electrodes 6 are formed is adjacent to a region where no lower electrodes 6 are formed.

Figure 4B:
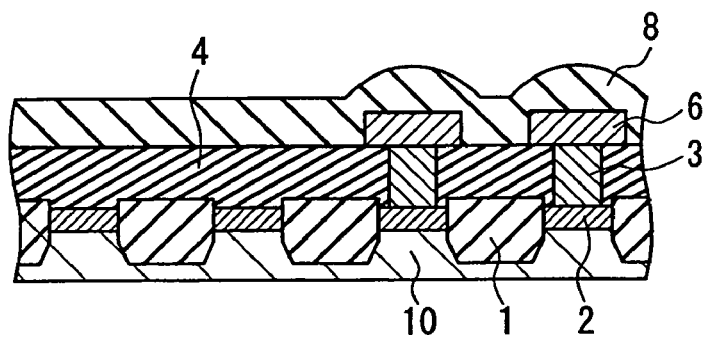

Then, covering the lower electrodes 6 and the interlayer insulation film 4, a burying insulating film 8 (400 nm thick) made of silicon oxide ($SiO_2$), for example, is formed over the entire wafer, as shown in FIG. 4B. It is preferable that the film thickness of this burying insulating film 8 is set to the thickness of the lower electrodes 6 plus a polishing margin that is necessary for step leveling during the polishing as explained below.

Figure 4C:
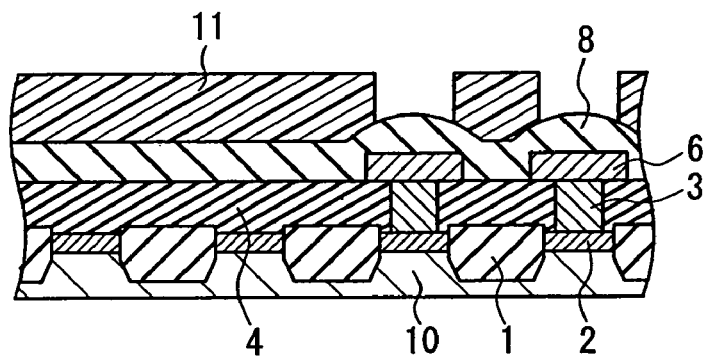
Figure 4D:
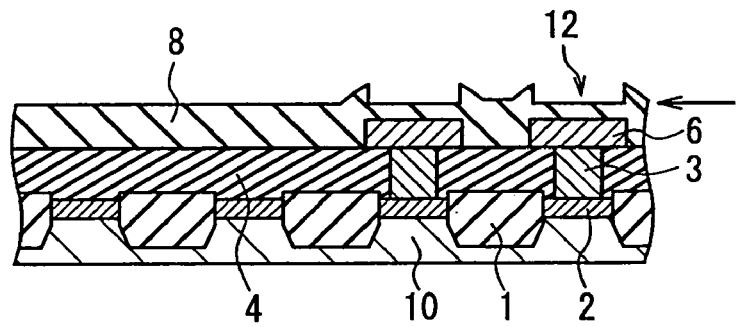

Then, using a resist mask, a resist pattern 11 having aperture portions is formed on the lower electrodes 6, as shown in FIG. 4C. Next, as shown in FIG. 4D, a portion of the insulating film 8 at the aperture portions of the resist pattern 11 is removed by dry etching, forming recesses 12. It is preferable that the depth of the recesses 12 is set to 300 nm, which is substantially equivalent to the film thickness of the lower electrodes 6, that is, to the step difference flattened by CMP. By doing so, the height of the bottom surface of the recesses 12 becomes substantially equal to the height of the insulating film 8 of the region where no lower electrodes 6 are formed, as indicated by the arrow in FIG. 4D.

Figure 4E:
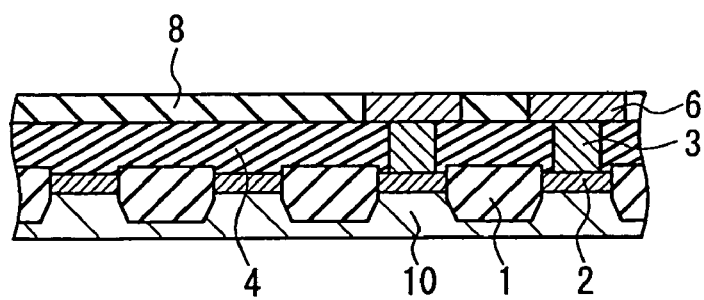

Then, as shown in FIG. 4E, the insulating film 8 is polished by CMP to planarize and smoothen its surface, and the surface is over-polished until a planar state is reached in which the lower electrodes 6 and the insulating film 8 are flush.

With this embodiment, in addition to the effects of the Embodiments 1 to 3, the effect is attained that the time for polishing until the surface of the insulating film 8 and the surface of the lower electrodes 6 become planar at the same height can be estimated by calculating the polishing speed of a solid film. As a result, it becomes possible to reduce to a minimum the influence that the wiring pattern density and the array surface area of the memory cell array portion have on the polishing time. Moreover, since there is no difference to the polishing speed of the peripheral circuit portion, the global step difference can be reduced.

Embodiment 5

Referring to FIGS. 5A to 5E, the following is a description of a method for manufacturing a ferroelectric memory according to Embodiment 5 of the present invention. FIGS. 5A to 5E show sectional views illustrating the manufacturing steps for a ferroelectric memory.

Figure 5A:
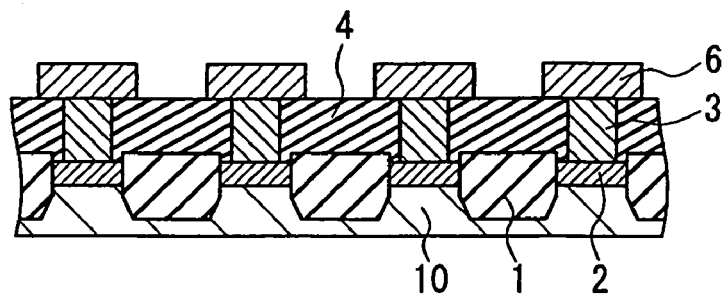
FIGS. 5A to 5E are sectional views illustrating a method for manufacturing a ferroelectric memory in accordance with Embodiment 5.

First, as shown in FIG. 5A, isolation regions 1 are formed on a semiconductor substrate 10, and a high-concentration impurity diffusion layer 2 is formed between the isolation regions 1. Then, an interlayer insulation film 4 made of $SiO_2$ is formed on the isolation regions 1 and the impurity diffusion layer 2, and contact plugs 3 (made of tungsten) that are electrically connected to the impurity diffusion layers 2 are formed in the interlayer insulation film 4. A layered film including a titanium nitride barrier layer (100 nm thick) and a platinum film (200 nm thick) serving as a first conductive film is formed on the interlayer insulation film 4 and the contact plugs 3. Next, the first conductive film is patterned by dry etching taking a resist pattern as a mask to form lower electrodes 6 (of 300 nm height) on the contact plugs 3.

Figure 5B:
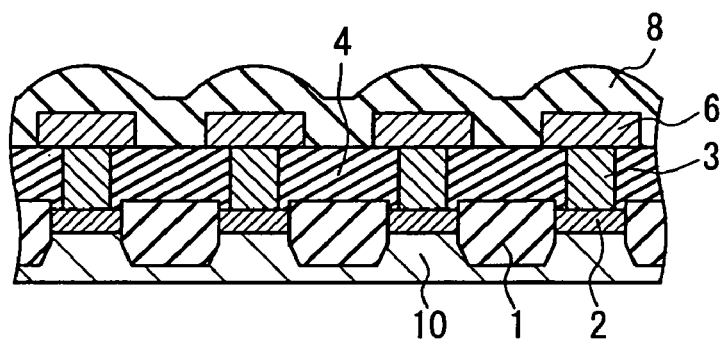

Then, covering the lower electrodes 6 and the interlayer insulation film 4, a burying insulating film 8 (400 nm thick) made of silicon oxide ($SiO_2$), for example, is formed over the entire wafer, as shown in FIG. 5B. It is preferable that the film thickness of this burying insulating film 8 is set to the thickness of the lower electrodes 6 plus a polishing margin that is necessary for step leveling during the polishing as explained below.

Figure 5C:
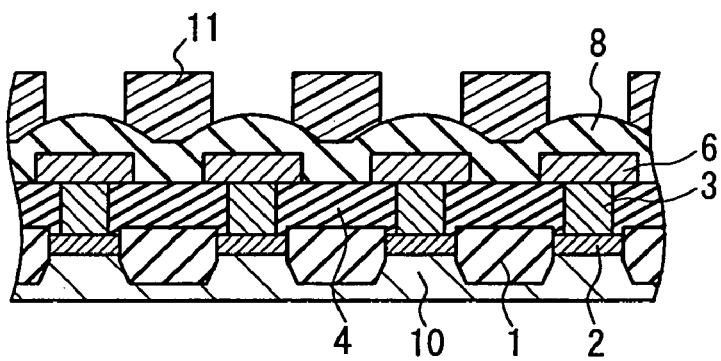
Figure 5D:
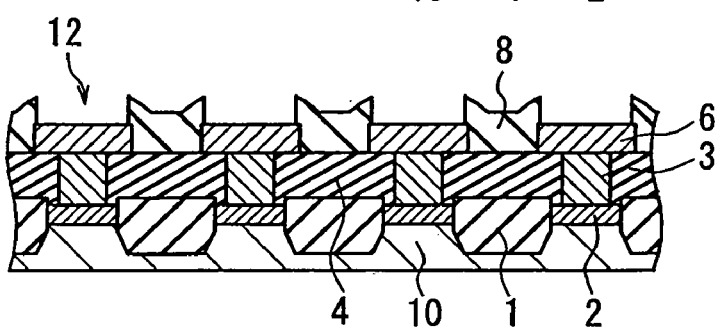
Figure 5E:
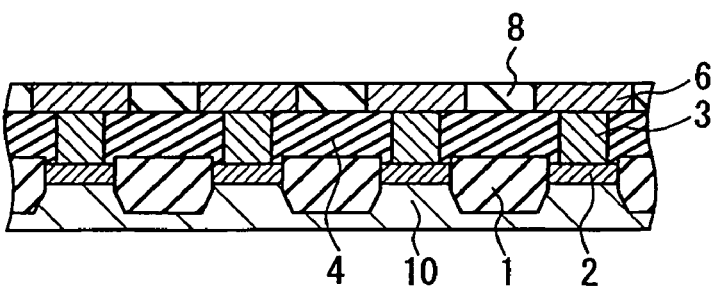

Then, using a resist mask, a resist pattern 11 having aperture portions is formed on the lower electrodes 6, as shown in FIG. 5C. Next, as shown in FIG. 5D, a portion of the insulating film 8 at the aperture portions of the resist pattern 11 is removed by dry etching until the lower electrodes 6 are exposed, forming recesses 12. Then, as shown in FIG. 5E, the insulating film 8 is polished by CMP to planarize and smoothen its surface, and the surfaces of the insulating film 8 and the lower electrodes 6 are made flush.

With this embodiment, in addition to the effects of the Embodiments 1 to 3, insufficient polishing above the lower electrodes 6 is reliably avoided by exposing the surface of the lower electrodes 6 when forming the recesses 12. Moreover, if only the step difference is planarized, it is possible to reliably prevent scratches by setting a polishing time with which the electrodes are not exposed with ordinary CMP.

Embodiment 6

Figure 6A:
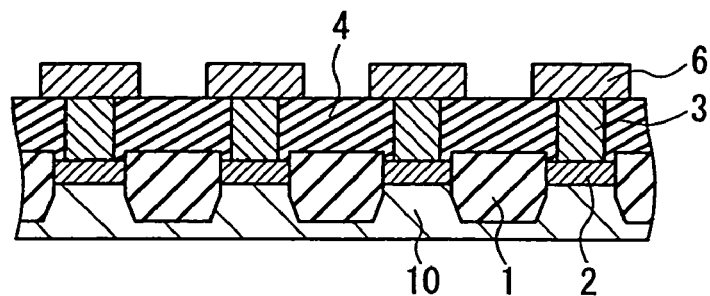
FIGS. 6A to 6E are sectional views illustrating a method for manufacturing a ferroelectric memory in accordance with Embodiment 6.
Figure 6B:
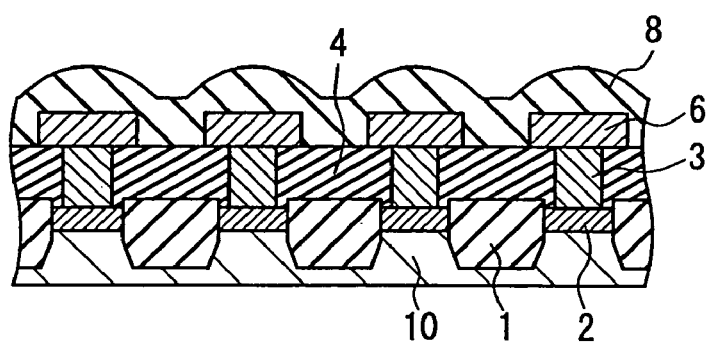
Figure 6C:
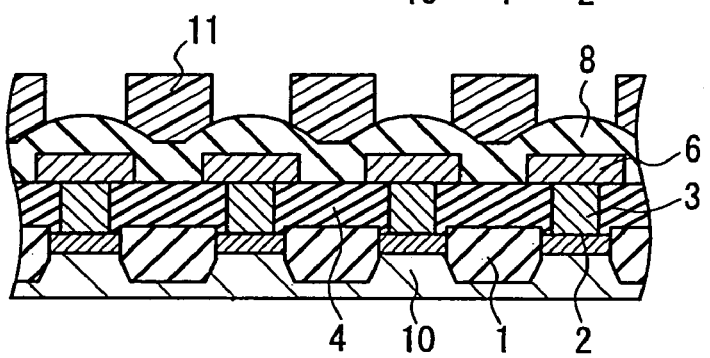

Referring to FIGS. 6A to 6E, the following is a description of a method for manufacturing a ferroelectric memory according to Embodiment 6. FIGS. 6A to 6E show sectional views illustrating the manufacturing steps of a ferroelectric memory. The steps in FIGS. 6A to 6C are similar to those in FIGS. 5A to 5C, so that like portions have been assigned like numerals, and their further explanation has been omitted.

Figure 6D:
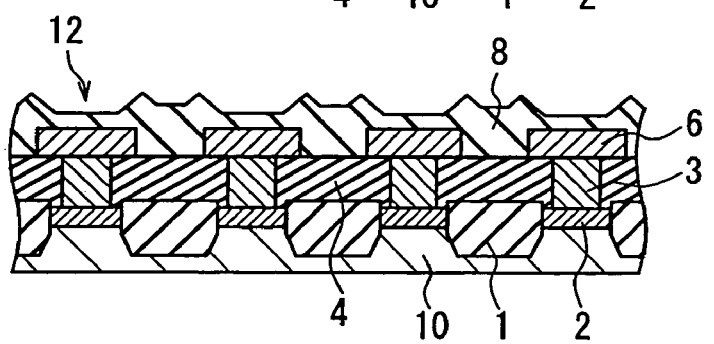

After the step shown in FIG. 6C, a portion of the insulating film 8 at the aperture portions of the resist pattern 11 is removed by dry etching to form the recesses 12, as shown in FIG. 6D. In this step, the dry etching is performed such that the taper angle of the formed recesses 12 (the angle defined by the side walls and the direction of the bottom plane of the recesses 12) becomes less than 90°. When dry etching using a mixed gas made of argon and oxygen, for example, this is possible by reducing the flow amount of argon, which is responsible for a highly anisotropic physical reaction and setting a high flow amount for the oxygen, which is responsible for a highly isotropic chemical reaction, so that the taper angle is regulated to a gently sloping direction.

Figure 6E:
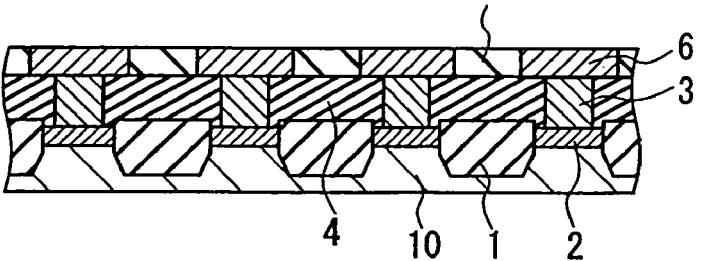

Next, as shown in FIG. 6E, the insulating film 8 is polished by CMP to planarize its surface, and the surfaces of the insulating film 8 and the lower electrodes 6 are over-polished until they are flush and planarized.

With this embodiment, in addition to the effects of the Embodiments 1 to 3, by providing a taper angle in the recesses 12, the effect is attained that the margin for displacements of the resist mask is increased, and the recesses 12 can be formed more precisely on the lower electrodes 6.

Embodiment 7

Figure 7A:
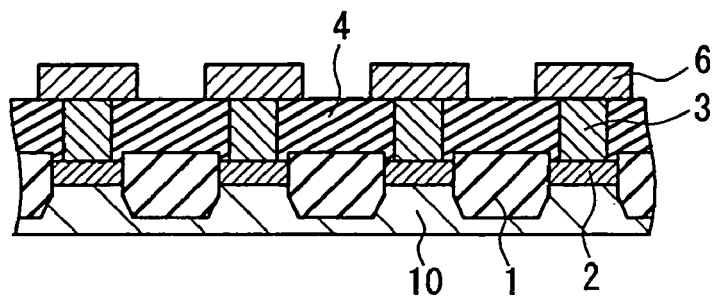
FIGS. 7A to 7E are sectional views illustrating a method for manufacturing a ferroelectric memory in accordance with Embodiment 7.
Figure 7B:
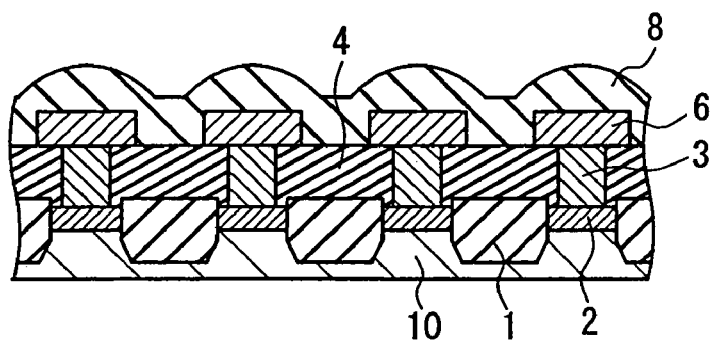

Referring to FIGS. 7A to 7E, the following is a description of a method for manufacturing a ferroelectric memory according to Embodiment 7. FIGS. 7A to 7E show sectional views illustrating the manufacturing steps of a ferroelectric memory. The steps in FIGS. 7A and 7B are similar to those in FIGS. 5A and 5B, so that like portions have been assigned like numerals, and their further explanation has been omitted.

Figure 7C:
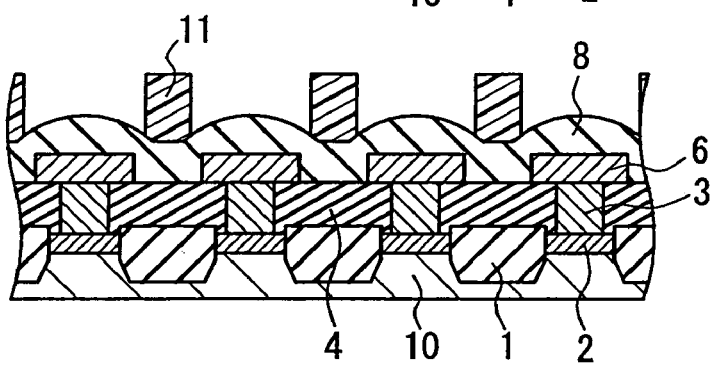

After the step shown in FIG. 7B, a resist mask is used to form a resist pattern 11 having aperture portions above the lower electrodes 6, as shown in FIG. 7C. In this embodiment, the surface area of the aperture portions is set larger than the surface area of the lower aperture portions 6.

Figure 7D:
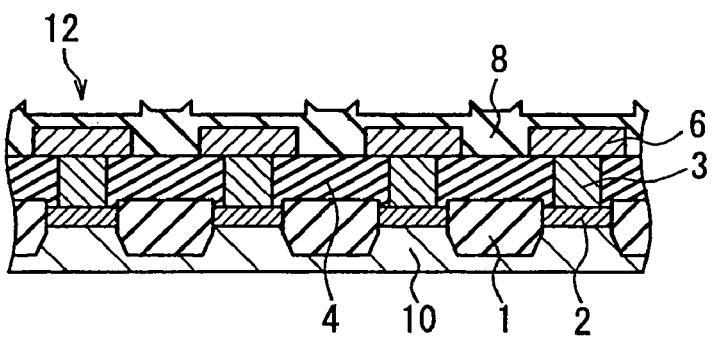
Figure 7E:
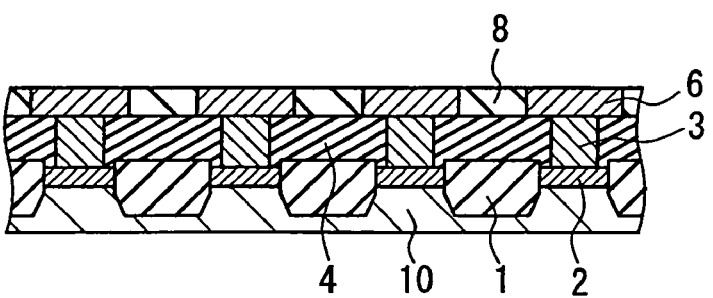

Next, a portion of the insulating film 8 at the aperture portions of the resist pattern 11 is removed by dry etching to form the recesses 12, as shown in FIG. 7D. Consequently, the surface area of the recesses 12 becomes larger than the surface area of the lower electrodes 6. Next, as shown in FIG. 7E, the insulating film 8 is polished by CMP to planarize its surface, and the surfaces of the insulating film 8 and the lower electrodes 6 are over-polished until they are flush and planarized.

With this embodiment, in addition to the effects of the Embodiments 1 to 3, by enlarging the aperture portions of the recesses 12, the polished volume of the insulating film 8 is reduced, thus attaining the effect of shorting the polishing time even better.

Embodiment 8

Figure 8A:
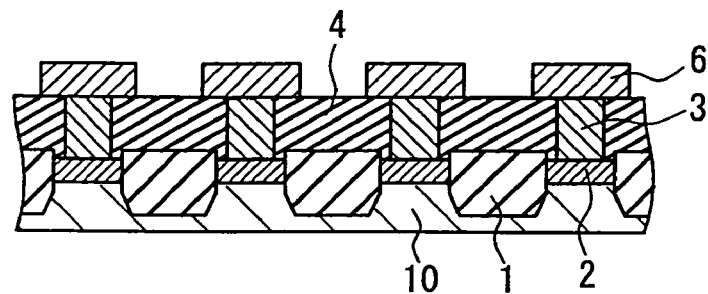
FIGS. 8A to 8E are sectional views illustrating a method for manufacturing a ferroelectric memory in accordance with Embodiment 8.
Figure 8B:
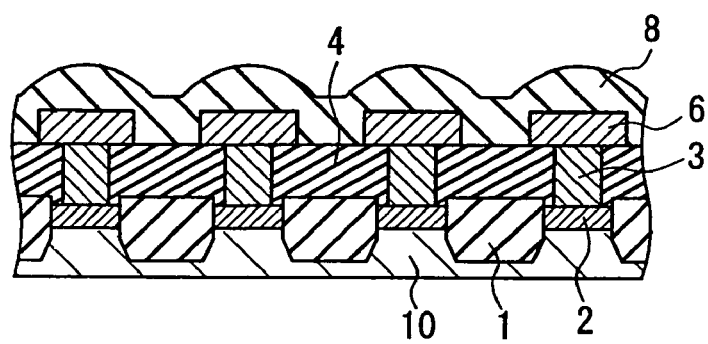

Referring to FIGS. 8A to 8E, the following is a description of a method for manufacturing a ferroelectric memory according to Embodiment 8. FIGS. 8A to 8E show sectional views illustrating the manufacturing steps of a ferroelectric memory. The steps in FIGS. 8A and 8B are similar to those in FIGS. 5A and 5B, so that like portions have been assigned like numerals, and their further explanation has been omitted.

Figure 8C:
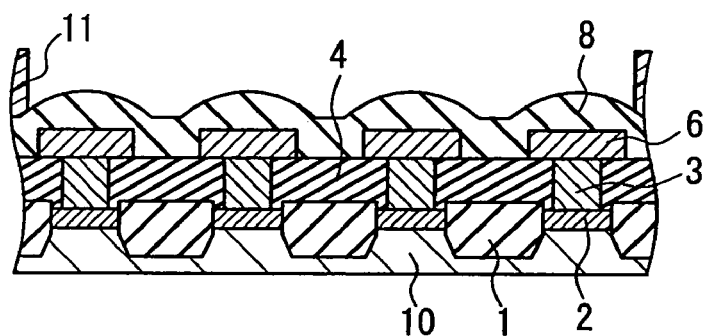

After the step shown in FIG. 8B, a resist mask is used to form a resist pattern 11 with aperture portions along a cell plate direction of the ferroelectric memory, as shown in FIG. 8C. The aperture portions are formed such that the region above a plurality of lower electrodes is included therein.

Figure 8D:
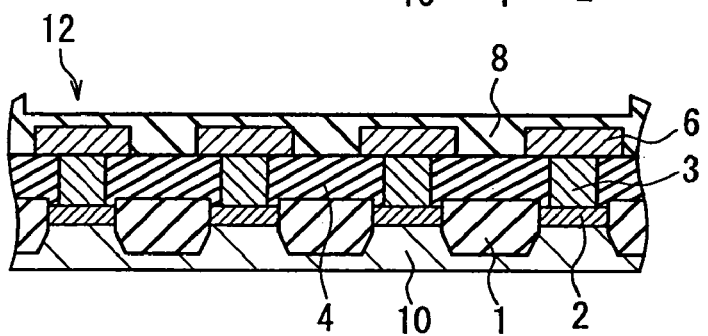
Figure 8E:
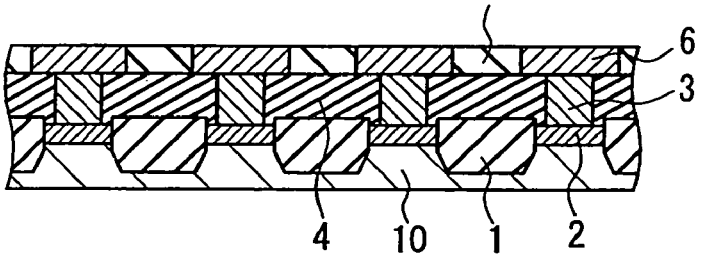

Next, a portion of the insulating film 8 at the aperture portions of the resist pattern 11 is removed by dry etching to form recesses 12, as shown in FIG. 8D. Consequently, a region above a plurality of lower electrodes 6 is included in the recesses 12. Here, the recesses 12 are formed at regions in which the wiring pattern density is high and the polishing speed is low, such as the memory cell array portion where the lower electrodes 6 are integrated. This accelerates the step leveling at the following polishing step. Then, as shown in FIG. 8E, the insulating film 8 is polished by CMP to planarize its surface, and the surfaces of the insulating film 8 and the lower electrodes 6 are over-polished until they are flush and planarized.

With this embodiment, the polishing amount of the insulating film 8 on the lower electrodes 6 is decreased by increasing the aperture surface area of the recesses 12, so that the polishing time can be shortened.

Embodiment 9

Embodiment 9 relates to the configuration of the ferroelectric memories. For example, the ferroelectric memory described in Embodiment 1 is characterized in that the surface area of the memory cell array is set within a range of 10,000 to 100,000 $\mu m^2$. This range is based on the realization that a condition of a surface polished by CMP for exposing the lower electrodes 6 is affected by the surface area of the memory cell array to which the memory cells are aggregated.

Figure 9:
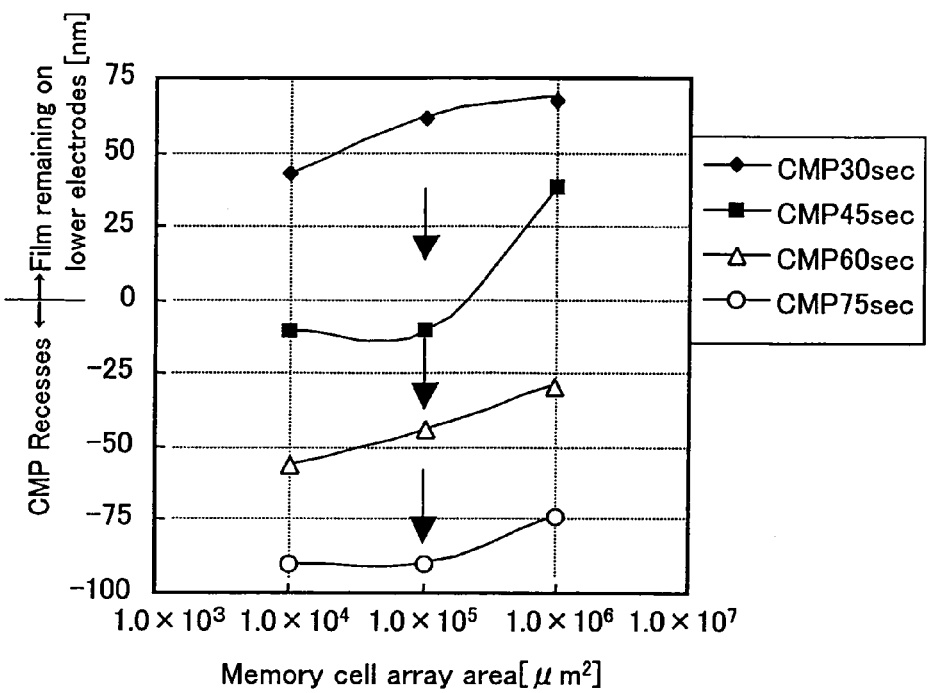
FIG. 9 is a graph illustrating the thickness of the remaining insulating film on the lower electrodes or the recesses formed around the lower electrodes as a function of array surface area.

FIG. 9 illustrates the thickness of the remaining insulating film on the lower electrodes 6 or the CMP recesses formed around the lower electrodes as a function of the memory cell array surface area (in $\mu m^2$), for different CMP polishing times (of 30 to 75 sec).

As shown in FIG. 9, in cases of memory cell arrays of 10,000 $\mu m^2$ and 100,000 $\mu m^2$ surface area, when the polishing time is varied between 30 sec and 75 sec, the lower electrodes 6 (Pt) are exposed at a polishing time of about 45 sec. And when the polishing time exceeds 45 sec, recesses having depths depending on the polishing time are formed, and the depths of recesses become similar with a progress of polishing even though the surface areas are different. On the other hand, it was found that when the memory cell array area exceeds 100,000 $\mu m^2$, and in particular at 1,000,000 $\mu m^2$, the thickness of the remaining film at an polishing time of 45 sec is about 40 nm, the lower electrodes 6 are not exposed, and the step leveling tends not to be accelerated.

Based on these results, it is desirable that the surface area of the memory cell array is set within a range of 10,000 to 100,000 $\mu m^2$. Thus, insufficient polishing, peeling of the lower electrodes and generation of scratches can be suppressed, and it becomes easy to attain the effect of reducing the global step difference.

Embodiment 10

Embodiment 10 relates to the configuration of the ferroelectric memories. For example, the ferroelectric memory described in Embodiment 1 is characterized in that the spacing S between adjacent memory cell array portions is set to a range within 10 to 100 $\mu m$. This range is based on the realization that the polishing by CMP for exposing the lower electrodes 6 is also affected by the spacing S between adjacent memory cell array portions.

Figure 10:
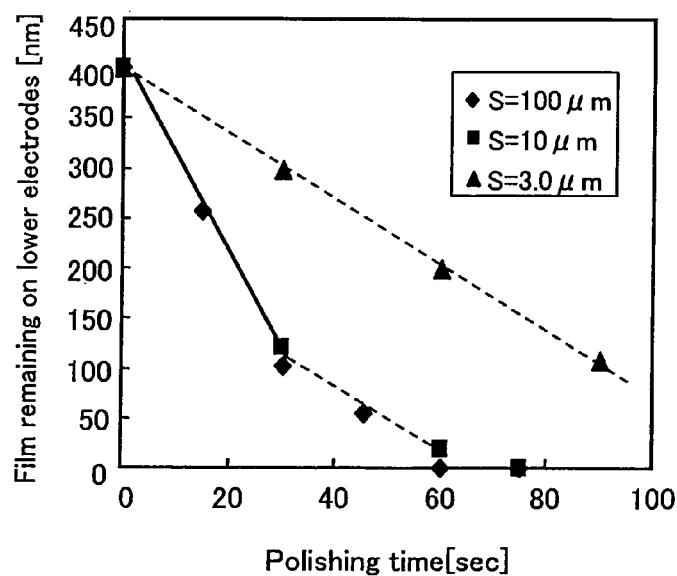
FIG. 10 is a graph illustrating the thickness of the remaining insulating film on the lower electrodes as a function of the polishing time.
Figure 11A:
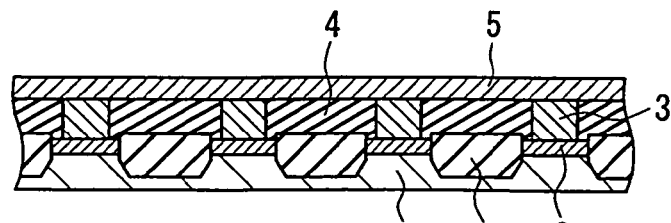
FIGS. 11A to 11F are sectional views illustrating a memory cell array portion during a conventional method for manufacturing a ferroelectric memory.
Figure 11B:
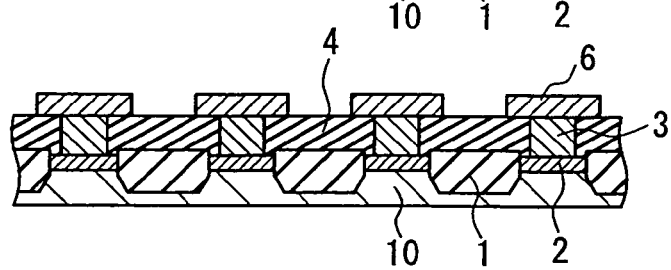
Figure 11C:
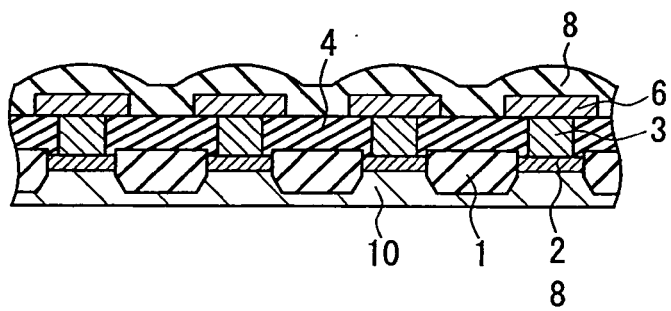
Figure 11D:
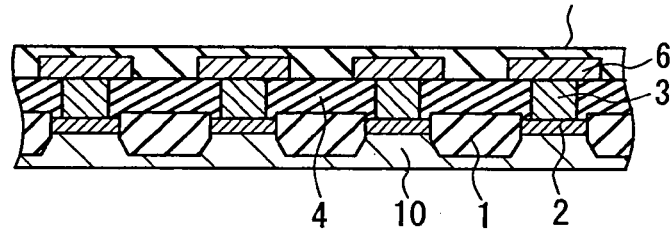
Figure 11E:
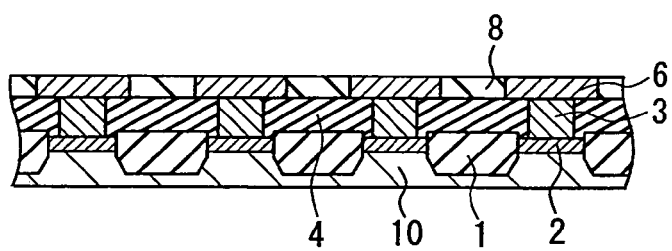
Figure 11F:
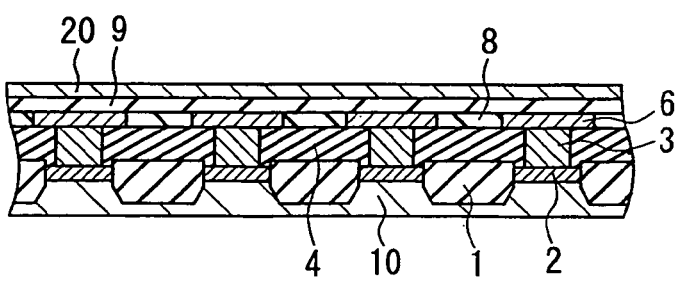
Figure 12A:
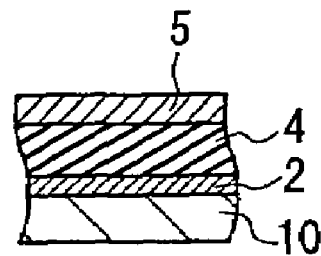
FIGS. 12A to 12E are sectional views illustrating a metal wiring portion during a conventional method for manufacturing a ferroelectric memory.
Figure 12B:
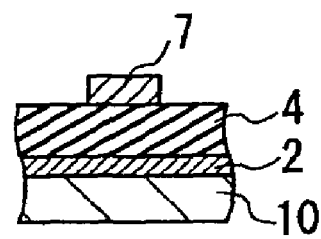
Figure 12C:
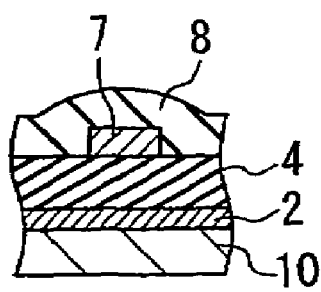
Figure 12D:
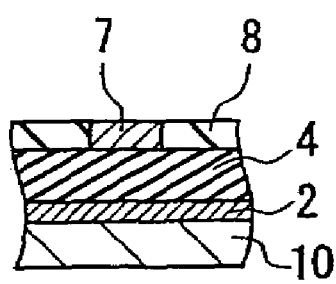
Figure 12E:
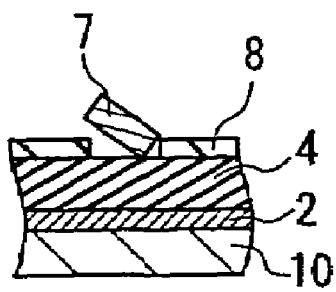
Figure 14:
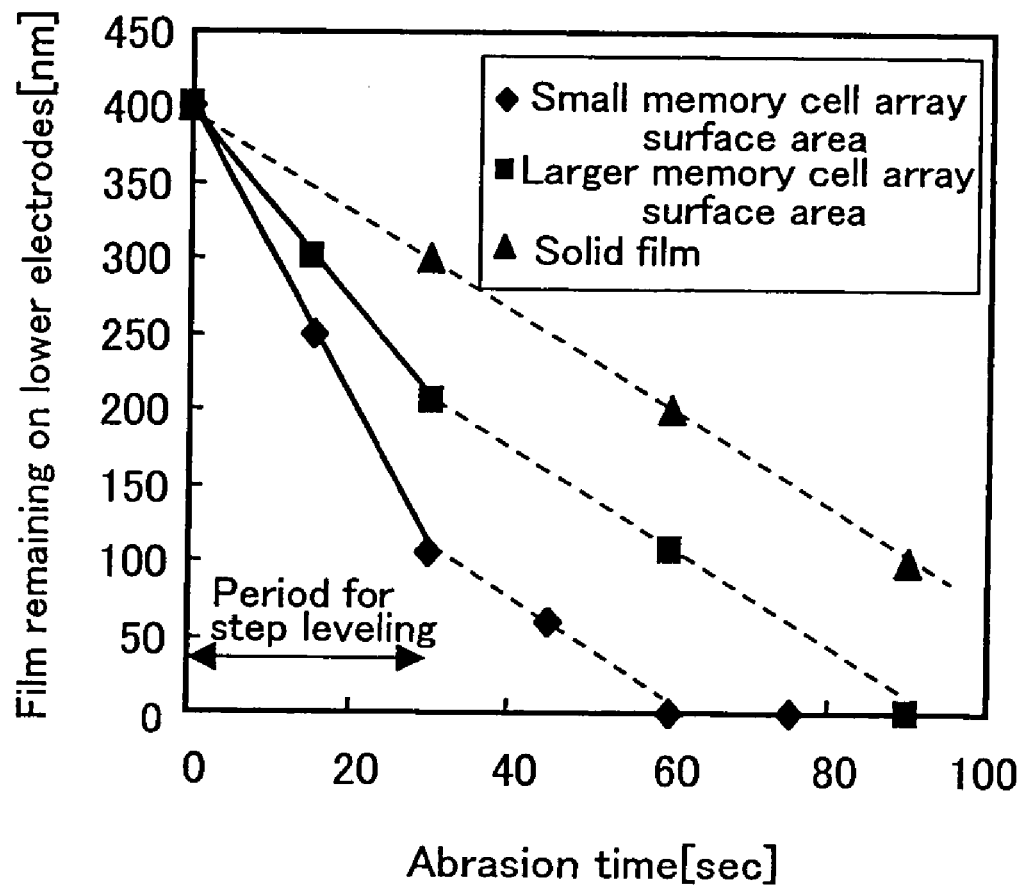
FIG. 14 is a graph illustrating the thickness of the remaining insulating film on the lower electrodes as a function of the polishing time.

FIG. 10 illustrates the thickness of the remaining insulating film on the lower electrodes 6 as a function of the polishing time, for different spacings S. As shown in FIG. 10, if the spacing S is 3.0 $\mu m$, the polishing progresses substantially with the polishing speed of the solid film, and the step leveling is hardly accelerated at all. On the other hand, it was found that if the spacing S is 10 $\mu m$, then substantially the same step leveling properties as for the case that the spacing S is 100 $\mu m$ are attained.

Based on these results, it is desirable that the spacing S of the adjacent memory cell arrays is set to at least 10 $\mu m$. If it is effectively set to a range of 10 to 100 $\mu m$, then insufficient polishing, peeling of the lower electrodes and generation of scratches can be suppressed, and the global step difference can be reduced.

In order not to increase the chip surface area it is possible to suitably combine regions of a spacing S with peripheral circuitry, such as sense amplifier portions, when devising the layout of the memory cell.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device, comprising:
   a substrate;
   a first insulating layer formed on the substrate;
   a contact plug formed in the first insulating layer;
   a capacitor element lower electrode formed on the first insulating layer and connected to the contact plug;
   a second insulating layer formed burying the capacitor element lower electrode and its surroundings;
   a capacitive insulating film formed covering the capacitor element lower electrode; and
   a capacitor element upper electrode formed above the capacitor element lower electrode with the capacitive insulating film interposed in between, such that the capacitor element lower electrode becomes a capacitance-defining area,
   wherein a plurality of capacitor elements composed of the capacitor element lower electrode, the capacitive insulating film and the capacitor element upper electrode are arranged in a capacitor element group, and wherein a surface of the capacitor element lower electrodes and the second insulating layer is planarized by polishing, and a surface area of the capacitor element group is within the range of 10,000 to 100,000 μm².

2. The semiconductor device according to claim 1, wherein a plurality of the capacitor element groups are provided, and a spacing between adjacent capacitor element groups is within the range of 10 to 100 μm.

3. The semiconductor device according to claim 1, wherein the capacitive insulating film is made of a ferroelectric film.

4. The semiconductor device according to claim 1, wherein the surfaces of the capacitor element lower electrode and the capacitor element upper electrode are made of Pt, Ir, Ru, and alloy thereof or a metal oxide thereof.

5. The semiconductor device according to claim 1, wherein the second insulating film is made of $O_3$-TEOS.

6. The semiconductor device according to claim 1, wherein the capacitor element lower electrode is made of a layered film including a titanium nitride layer and a platinum film.

* * * * *